(12) United States Patent
Ohno

(10) Patent No.: US 11,769,984 B2
(45) Date of Patent: Sep. 26, 2023

(54) LASER MODULE, LASER OSCILLATOR AND LASER PROCESSING SYSTEM

(71) Applicant: Panasonic Holdings Corporation, Osaka (JP)

(72) Inventor: Hiroshi Ohno, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/814,251

(22) Filed: Jul. 22, 2022

(65) Prior Publication Data
US 2023/0035398 A1 Feb. 2, 2023

(30) Foreign Application Priority Data

Jul. 30, 2021 (JP) .................................. 2021-125609
Jul. 30, 2021 (JP) .................................. 2021-125612

(51) Int. Cl.
*H01S 5/00* (2006.01)
*H01S 5/40* (2006.01)
(Continued)

(52) U.S. Cl.
CPC ........ *H01S 5/0021* (2013.01); *B23K 26/0648* (2013.01); *G01J 1/4257* (2013.01); *G02B 19/0009* (2013.01); *G02B 19/0085* (2013.01); *H01S 5/02326* (2021.01); *H01S 5/4025* (2013.01)

(58) Field of Classification Search
CPC .... H01S 5/4056; H01S 5/4031; H01S 5/4025; H01S 5/02326; H01S 5/02325; H01S 5/023; H01S 5/0021; H01S 5/001; G02B 19/0085; G02B 19/0009; G01J 1/4257; B23K 26/0648; B23K 26/0643; B23K 26/064
See application file for complete search history.

(56) References Cited

U.S. PATENT DOCUMENTS 6,865,197 B2 * 3/2005 Sugitatsu ............ H01S 5/02251
372/32
11,196,234 B2 * 12/2021 Tayebati ................. H01S 5/142
(Continued)

FOREIGN PATENT DOCUMENTS

EP 0859947 A1 8/1998
JP S60-144261 U 9/1985
(Continued)

*Primary Examiner* — John R Lee
(74) *Attorney, Agent, or Firm* — PEARNE & GORDON LLP

(57) ABSTRACT

A laser module includes: a laser diode bar including a plurality of emitters configured to emit laser light from a front surface and leak light from a rear surface; a housing including a reflecting surface configured to surround a space together with the laser diode bar and reflect, toward the space, light leaked from the rear surface, in a scattering manner; and a detector configured to detect light reflected by the reflecting surface. A laser module includes: a laser diode bar including a plurality of emitters configured to emit laser light from a front surface and leak light from a rear surface; a condenser lens on which light leaked from rear surfaces of all of the plurality of emitters impinges; and a detector configured to detect light transmitted through the condenser lens.

14 Claims, 8 Drawing Sheets

(51) Int. Cl.
*H01S 5/02326* (2021.01)
*G02B 19/00* (2006.01)
*G01J 1/42* (2006.01)
*B23K 26/06* (2014.01)

(56) References Cited

U.S. PATENT DOCUMENTS

| | | | |
|---|---|---|---|
| 11,435,567 B2* | 9/2022 | Wakabayashi | G03B 21/2033 |
| 2017/0304942 A1* | 10/2017 | Ogata | H01S 5/4087 |
| 2018/0041012 A1 | 2/2018 | Tayebati et al. | |
| 2023/0035398 A1* | 2/2023 | Ohno | G02B 19/0057 |

FOREIGN PATENT DOCUMENTS

| | | |
|---|---|---|
| JP | H03-008384 A | 1/1991 |
| JP | H04-130645 A | 5/1992 |
| JP | H11-513198 A | 11/1999 |
| JP | 2003-347645 A | 12/2003 |
| JP | 2009-283735 A | 12/2009 |
| JP | 2012-089585 A | 5/2012 |
| JP | 2013-037025 A | 2/2013 |
| JP | 2017-183690 A | 10/2017 |
| JP | 2018-018978 A | 2/2018 |
| JP | 2019-525475 A | 9/2019 |
| JP | 2021-057445 A | 4/2021 |
| WO | 98/02719 A1 | 1/1998 |

* cited by examiner

LASER MODULE, LASER OSCILLATOR AND LASER PROCESSING SYSTEM

CROSS REFERENCE TO RELATED APPLICATIONS

This application is entitled to and claims the benefit of Japanese Patent Applications No. 2021-125609, filed on Jul. 30, 2021 and No. 2021-125612, filed on Jul. 30, 2021, the disclosure of which including the specification, drawings and abstract are incorporated herein by reference in its entirety.

TECHNICAL FIELD

The present disclosure relates to a laser module, a laser oscillator and a laser processing system.

BACKGROUND ART

PTL 1 discloses a semiconductor laser device including a semiconductor laser bar with a plurality of light emission points, and a heat sink attached to one side of the semiconductor laser bar. A first submount and a molybdenum reinforced member are attached to the heat sink, and a second submount is attached to the other side of the semiconductor laser bar. The first submount, the molybdenum reinforced member, and the second submount are provided with different linear expansion coefficients in order to suppress the deformation of the semiconductor laser bar. In this manner, degradation of the plurality of light emission points can be suppressed.

CITATION LIST

Patent Literature

PTL 1
Japanese Patent Application Laid-Open No. 2012-89585

SUMMARY OF INVENTION

Technical Problem

The semiconductor laser bar disclosed in PTL 1 cannot detect the degradation of the light emission characteristics and the defects of the semiconductor laser bar. The degradation of the light emission characteristics and the defects of the semiconductor laser bar affect the characteristics of the system using the semiconductor laser bar.

An object of the present disclosure is to detect the degradation of the light emission characteristics and the defects of a laser module in a laser module.

Solution to Problem

A laser module of the present disclosure includes: a laser diode bar including a plurality of emitters configured to emit laser light from a front surface and leak light from a rear surface; a housing including a reflecting surface configured to surround a space together with the laser diode bar and reflect, toward the space, light leaked from the rear surface, in a scattering manner; and a detector configured to detect light reflected by the reflecting surface.

In addition, a laser oscillator and a laser processing system of the present disclosure include the above-described laser module.

A laser module of the present disclosure includes: a laser diode bar including a plurality of emitters configured to emit laser light from a front surface and leak light from a rear surface; a condenser lens on which light leaked from rear surfaces of all of the plurality of emitters impinges; and a detector configured to detect light transmitted through the condenser lens.

In addition, a laser oscillator and a laser processing system of the present disclosure include the above-described laser module.

Advantageous Effects of Invention

With the laser module, the laser oscillator and the laser processing system according to the present disclosure, it is possible to detect the degradation of the light emission characteristics and the defects of a laser module in a laser module.

DESCRIPTION OF EMBODIMENTS

First Disclosure
Laser Module

First Embodiment

Figure 1:
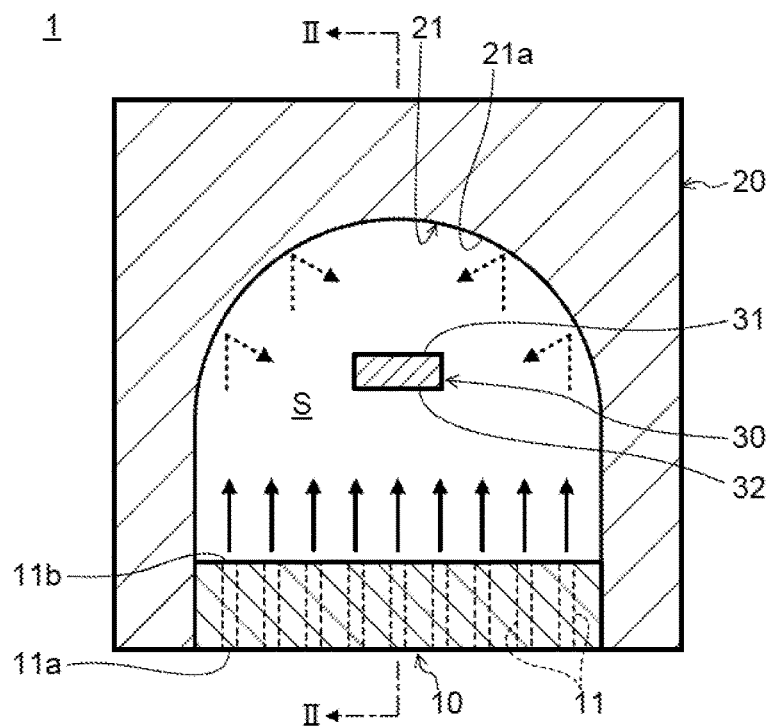
FIG. 1 is a sectional view illustrating a laser module according to a first embodiment of the present disclosure.
Figure 2:
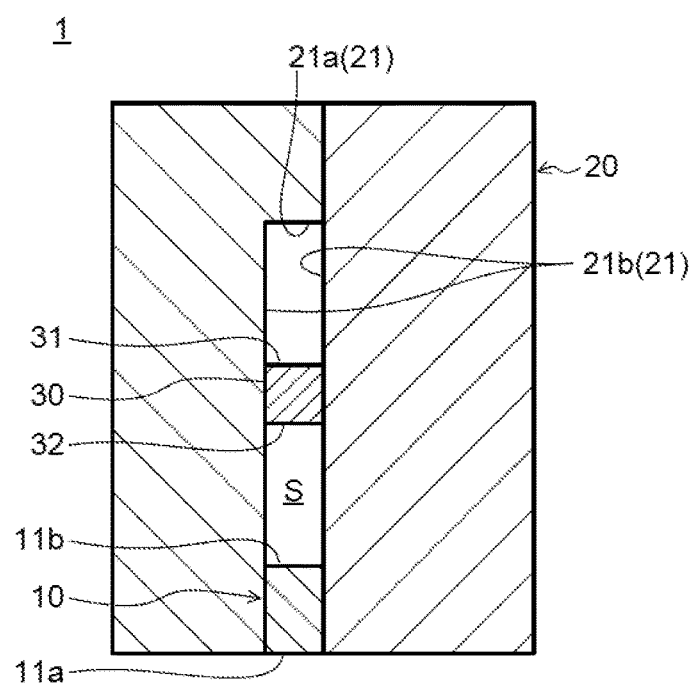
FIG. 2 is a sectional view along line II-II of FIG. 1.

A laser module according to a first embodiment of the present disclosure is described below with reference to the drawings. FIGS. 1 and 2 are sectional views illustrating a configuration of laser module 1. Laser module 1 includes laser diode bar 10, housing 20, and detector 30.

Laser diode bar 10 has a rectangular shape in plan view. Laser diode bar 10 includes a plurality of light waveguide type emitters 11. The plurality of emitters 11 are disposed side by side in the longitudinal direction of laser diode bar 10.

The plurality of emitters 11 includes a light-emitting layer (not illustrated in the drawing) that emits light when a voltage is applied and a supply current is provided. Front end surface 11a and rear end surface 11b of light waveguide type emitter 11 are disposed on the opposite sides in the short direction of laser diode bar 10. Front end surface 11a and rear end surface 11b of emitter 11 are provided to reflect light. The light reflectance of front end surface 11a is lower than the light reflectance of rear end surface 11b. The light reflectance of rear end surface 11b is equal to or greater than 90% and smaller than 100%, preferably equal to or greater than 95%.

The light generated at the light-emitting layer is reflected by front end surface 11a and rear end surface 11b and thus repeatedly reciprocated in the light waveguide (not illustrated in the drawing), and, amplified. Through laser oscillation, the amplified light is emitted as laser light from front end surface 11a along the direction orthogonal to front end surface 11a.

On the other hand, when the light generated at the light-emitting layer is repeatedly reciprocated in the light waveguide, a part of the light generated at the light-emitting layer is leaked from rear end surface 11b along the direction orthogonal to rear end surface 11b. In FIGS. 1 to 6, the solid thick arrow represents light leaked from rear end surface 11b.

Laser diode bar 10 is fixed to housing 20 such that front end surfaces 11a of the plurality of emitters 11 are exposed.

Housing 20 includes reflecting surface 21 that surrounds space S together with laser diode bar 10 in its inside. Space S is provided with a width equal to or greater than the length of the longitudinal direction of laser diode bar 10, so as to extend in the short direction of laser diode bar 10 (FIG. 1). In addition, the thickness of space S is greater than the thickness of laser diode bar 10 (FIG. 2). Laser diode bar 10 is connected to a submount member (not illustrated in the drawing) with a relatively high heat-dissipation property through an AuSn solder layer or the like.

Laser diode bar 10 is disposed such that rear end surfaces 11b of the plurality of emitters 11 face space S. Light leaks toward space S from rear end surfaces 11b of the plurality of emitters 11.

Reflecting surface 21 is an inner surface of housing 20 that forms space S. Reflecting surface 21 reflects, toward space S, light leaked from rear end surface 11b in such a manner as to scatter the light. In FIGS. 1 to 6, the thick broken arrow represents light reflected by reflecting surface 21.

Reflecting surface 21 has a shape that repeatedly reflects the light leaked from rear end surface 11b. Reflecting surface 21 includes curved surface 21a with a semicircular shape in a cross section at a portion facing rear end surfaces 11b of the plurality of emitters 11. Note that reflecting surface 21 may have a polygonal shape in a cross section. In addition, reflecting surface 21 includes two flat surfaces 21b that face each other to sandwich laser diode bar 10.

Reflecting surface 21 has a rough surface. Reflecting surface 21 is a sprinkled surface with fine irregularities. In this manner, reflecting surface 21 can efficiently scatter the light leaked from rear end surface 11b. Note that reflecting surface 21 may be coated with a coating agent containing scattering members such as nitric acid barium and titanium oxide.

In addition, preferably, the absorptivity of the light leaked from rear end surface 11b at reflecting surface 21 is equal to or greater than 10%. In this manner, even when the light leaked from rear end surface 11b is repeatedly reflected, attenuation of the intensity of the light reflected from rear end surface 11b can be suppressed.

Detector 30 detects the light reflected by reflecting surface 21. Detector 30 is a photodiode (e.g., a PIN-type photodiode), for example. Detector 30 is disposed in space S.

Detector 30 is disposed such that light-receiving surface 31 of detector 30 faces reflecting surface 21 side. Detector 30 is disposed such that back surface 32 of detector 30 faces rear end surfaces 11b of the plurality of emitters 11. In this manner, the light leaked from rear end surface 11b can be prevented from directly impinging on light-receiving surface 31 at detector 30. Thus, detector 30 can detect only the light reflected by reflecting surface 21. Detector 30 outputs the detection signal to the outside of housing 20 through the wiring (not illustrated in the drawing).

Next, an operation of laser module 1 is described. When a voltage is applied to the plurality of emitters 11 and a current flows therethrough, laser light is emitted from front end surface 11a, and light leaks from rear end surface 11b toward space S.

The light leaked from rear end surface 11b is reflected in a scattering manner by reflecting surface 21 toward space S. In addition, the light reflected by reflecting surface 21 further impinges on reflecting surface 21 so as to be reflected in a scattering manner. In this manner, the light leaked from rear end surface 11b is repeatedly reflected by reflecting surface 21. In this manner, the intensity of the light leaked from rear end surface 11b is uniformed in space S.

A part of the light reflected and uniformed by reflecting surface 21 impinges on light-receiving surface 31 of detector 30. Detector 30 outputs, to the outside, a detection signal corresponding to the intensity of the light incident on light-receiving surface 31.

Next, the case where the light emission characteristics of at least one emitter 11 of the plurality of emitters 11 are degraded is described. When the light emission characteristics of at least one emitter 11 of the plurality of emitters 11 are degraded, the intensity of the light leaked from rear end surface 11b of one emitter 11 is reduced. As a result, the light leaked from rear end surfaces 11b of the plurality of emitters 11 is reflected by reflecting surface 21, and thus the intensity of the uniformed light is also reduced. As a result, the intensity of a part of the uniformed light detected by detector 30 decreases, and the detection signal changes. In this system, the emitter 11 where the light emission characteristics are degraded cannot be identified, but the degree of the degradation of the light emission characteristics at the plurality of emitters 11 can be detected.

Specifically, by monitoring the detection signal, the occurrence of the degradation of the light emission characteristics of at least one emitter 11 of the plurality of emitters 11 can be detected based on the change of the detection signal. The same applies to the case where the intensity of the light leaked from rear end surface 11b is reduced due to defects of laser module 1. Thus, the degradation of the light emission characteristics and the defects of laser module 1 can be detected.

Second Embodiment

Figure 3:
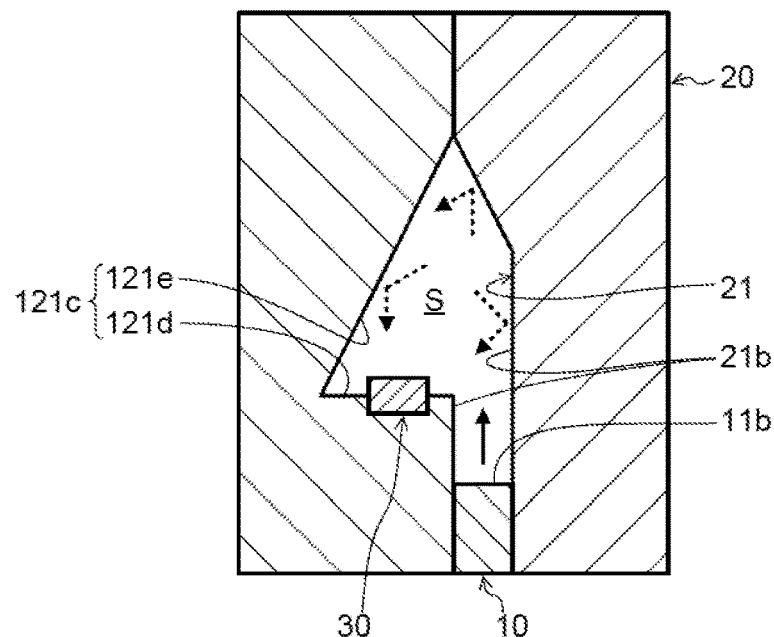
FIG. 3 is a sectional view illustrating a laser module according to a second embodiment of the present disclosure.

Next, a laser module according to a second embodiment of the present disclosure is described with reference to FIG. 3 mainly regarding differences from the first embodiment.

Space S provided in housing 20 in the second embodiment includes recess 121c at one flat surface 21b of two flat surfaces 21b. Recess 121c has a triangular shape in a cross section, and includes first surface 121d facing substantially the same direction as the plurality of emitters 11, and second surface 121e tilted with respect to first surface 121d. First surface 121d and second surface 121e make up reflecting surface 21. In addition, at a portion facing rear end surfaces 11b of the plurality of emitters 11 in reflecting surface 21 is tilted to face recess 121c.

With reflecting surface 21 including recess 121c in the above-described manner, the number of times of the reflection, at reflecting surface 21, of the light leaked from rear end surface 11b can be increased. Thus, the intensity of the light leaked from rear end surface 11b can be further uniformed in space S.

Detector 30 is disposed at first surface 121d. That is, detector 30 does not face rear end surfaces 11b of the plurality of emitters 11. In other words, detector 30 is disposed outside the region between rear end surfaces 11b of the plurality of emitters 11 and a portion of reflecting surface 21 facing rear end surface 11b in space S. In addition, detector 30 is disposed apart from the plane including the axis of the light leaked from rear end surfaces 11b of the plurality of emitters 11.

With this arrangement of detector 30, the light leaked from rear end surfaces 11b of the plurality of emitters 11 does not directly impinges on back surface 32 and light-receiving surface 31 of detector 30. Thus, the light leaked from rear end surfaces 11b of all of the plurality of emitters 11 can directly impinge on reflecting surface 21 and scattered. In this manner, the intensity of the light leaked from rear end surface 11b can be further uniformed in space S.

In addition, with detector 30 located at the above-described position, the light path length from leakage from rear end surfaces 11b of the plurality of emitters 11 to impingement on detector 30 can be increased than that with the position of detector 30 of the first embodiment. When the light path length increases, the number of times of the reflection, at reflecting surface 21, of the light leaked from rear end surface 11b increases. Thus, the intensity of the light incident on light-receiving surface 31 of detector 30 can be further uniformed in space S.

Third Embodiment

Figure 4:
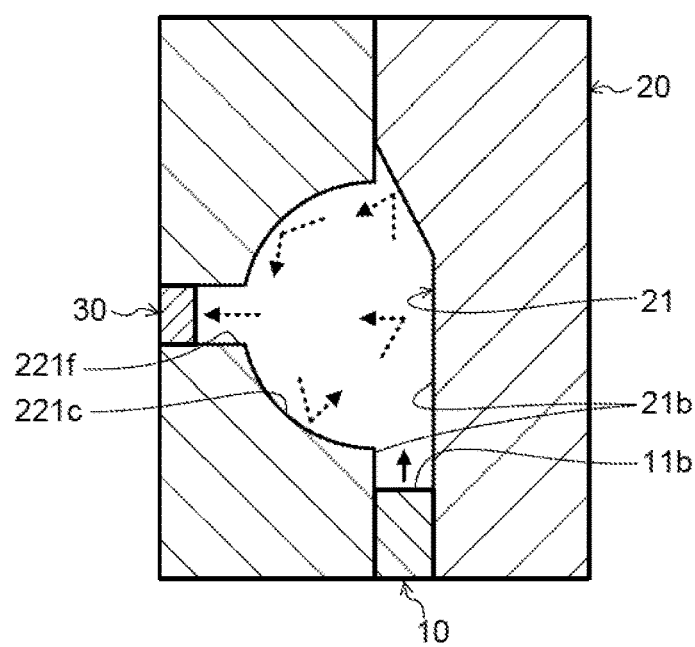
FIG. 4 is a sectional view illustrating a laser module according to a third embodiment of the present disclosure.

Next, a laser module according to the third embodiment of the present disclosure is described with reference to FIG. 4 mainly regarding differences from the second embodiment.

In the third embodiment, recess 221c has a hemispherical shape. With reflecting surface 21 including such a recess 221c, the number of times of the reflection, at reflecting surface 21, of the light leaked from rear end surface 11b can be further increased. In addition, since recess 221c has a hemispherical shape, and the intensity of the light is uniformed regardless of the incident angle as an integrating sphere. Thus, the intensity of the light leaked from rear end surface 11b can be further uniformed in space S.

In addition, housing 20 further includes first passage 221f that opens at the bottom portion of recess 221c and communicates between space S and the outside. Detector 30 is disposed in first passage 221f such that a part of detector 30 is exposed. In this manner, a wiring for outputting the detection signal to the outside can be disposed in a simple manner.

In addition, with detector 30 disposed in first passage 221f that opens at the bottom portion of recess 221c, the light path length from leakage from rear end surfaces 11b of the plurality of emitters 11 to impingement on detector 30 can be increased than that with the position of detector 30 in the first embodiment. Thus, the intensity of the light incident on light-receiving surface 31 of detector 30 can be further uniformed in space S.

In addition, with detector 30 disposed in first passage 221f and flat surface 21b including recess 221c, the light leaked from rear end surface 11b can be prevented from directly impinging on light-receiving surface 31 of detector 30. Thus, the light leaked from rear end surfaces 11b of all of the plurality of emitters 11 can directly impinge on reflecting surface 21 and scattered. Thus, the intensity of the light leaked from rear end surface 11b can be further uniformed in space S.

Fourth Embodiment

Figure 5:
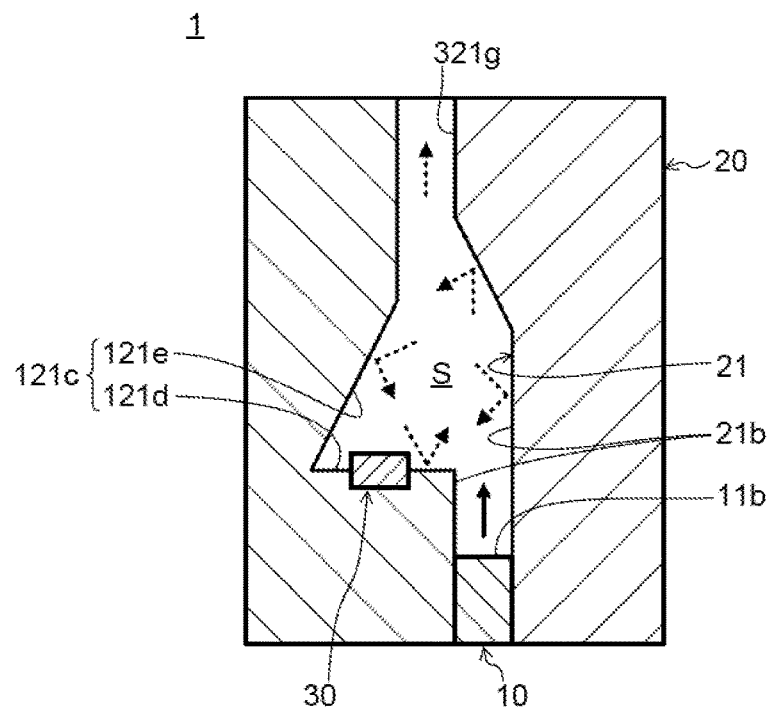
FIG. 5 is a sectional view illustrating a laser module according to a fourth embodiment of the present disclosure.

Next, a laser module according to the fourth embodiment of the present disclosure is described with reference to FIG. 5 mainly regarding differences from the second embodiment.

In the fourth embodiment, housing 20 further includes second passage 321g that opens at second surface 121e and communicates between space S and the outside. Second passage 321g guides, to the outside, a part of light uniformed through reflection at reflecting surface 21. In this manner, it is possible to attenuate the intensity of the uniformed light in space S.

Thus, even in the case where the intensity of the light leaked from rear end surfaces 11b of the plurality of emitters 11 is relatively large, detector 30 can appropriately detect the light reflected by reflecting surface 21 within the range of the light intensity that can be detected by detector 30.

Modification of Fourth Embodiment

Figure 6:
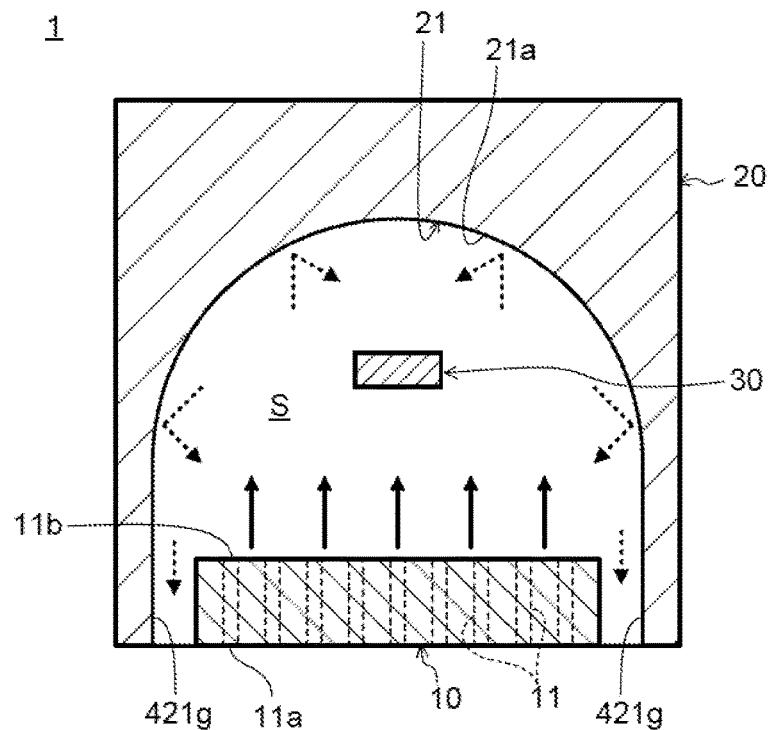
FIG. 6 is a sectional view illustrating a laser module according to a modification of the fourth embodiment of the present disclosure.

As illustrated in FIG. 6, in a laser module according to a modification of the fourth embodiment, second passage 421g is provided on both sides of laser diode bar 10 in the longitudinal direction in housing 20.

Laser Oscillator and Laser Processing System

Figure 7:
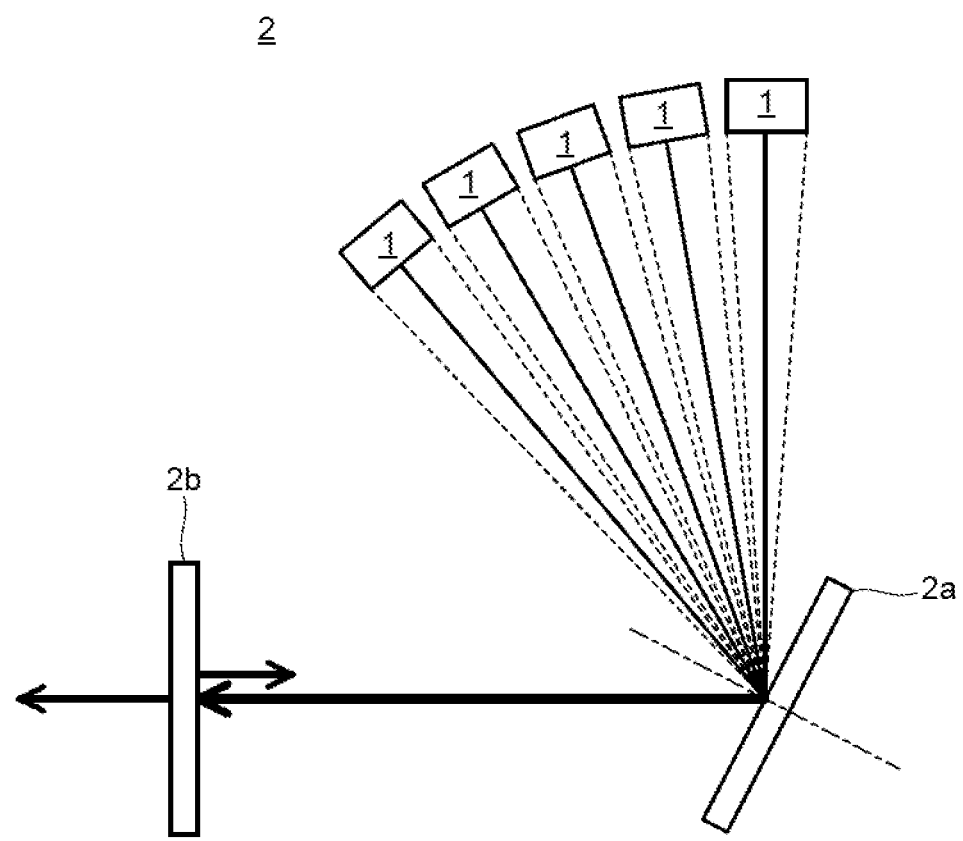
FIG. 7 is a schematic view illustrating a configuration of a laser oscillator used for a laser processing system of the present disclosure.

The laser processing system is a system used for metal processing with high output laser light and the like, and includes high output laser oscillator 2 that outputs laser light of 100 W to several kW or greater, an optical fiber (not illustrated in the drawing), a laser processing head (not illustrated in the drawing), a movable stage (not illustrated in the drawing) for placing workpieces, and the like. As illustrated in FIG. 7, high output laser oscillator 2 used for the laser processing system includes a plurality of laser modules 1, diffraction grating 2a, and external resonance mirror 2b.

The plurality of laser modules 1 are arranged in a line. Diffraction grating 2a is a transmitting or reflecting diffraction grating. External resonance mirror 2b is a partial transmission mirror.

Laser light is emitted from the plurality of emitters 11 of respective laser modules 1. The laser light emitted from each laser module 1 impinges on diffraction grating 2a.

Diffraction grating 2a diffracts the incident laser light at the diffraction angle determined by the wavelength of the laser light and emits the light. The laser light emitted from diffraction grating 2a impinges on external resonance mirror 2b.

External resonance mirror 2b perpendicularly reflects a part of the incident laser light, in the direction of diffraction grating 2a. In this manner, only the wavelength that satisfies the diffraction condition of diffraction grating 2a in the positional relationship between emitters 11 of the plurality of laser modules 1, diffraction grating 2a, and external resonance mirror 2b is fed back between laser module 1 and external resonance mirror 2b and externally resonated and oscillated, and thus the laser light is output. In this case, it is desirable that the reflectance of front end surface 11a of laser module 1 is equal to or smaller than 0.5%, more preferably equal to or smaller than 0.1%, and that only the external resonance oscillation at external resonance mirror 2b is generated, without generating the internal resonance oscillation at light waveguide end surfaces 11a and 11b of laser module 1. Note that a beam twister unit (not illustrated in the drawing) that rotates laser light 90 degrees around the optical axis may be disposed between diffraction grating 2a and the plurality of laser modules 1.

When metal processing or the like is performed by using the laser processing system, each detection signal output from detector 30 of the plurality of laser modules 1 making up high output laser oscillator 2 is monitored in real time. Thus, the change of the detection signal is detected in real time. Thus, the degradation of the light emission characteristics and the defects of laser module 1 can be individually detected. In addition, the laser module 1 where the degradation of the light emission characteristics and the like occur can be detected from among the plurality of laser modules 1.

While laser light is emitted from front end surface 11a of emitter 11 and light leaks from rear end surface 11b of emitter 11 in the above-described embodiment, it goes without saying that this is not limitative. Specifically, it suffices that laser light is emitted from the surface (i.e., the front surface) exposed to the outside from housing 20 in emitter 11. In addition, it suffices that light leaks from the surface (i.e., the rear surface) facing space S in emitter 11.

Second Disclosure

Laser Module

Fifth Embodiment

Figure 8:
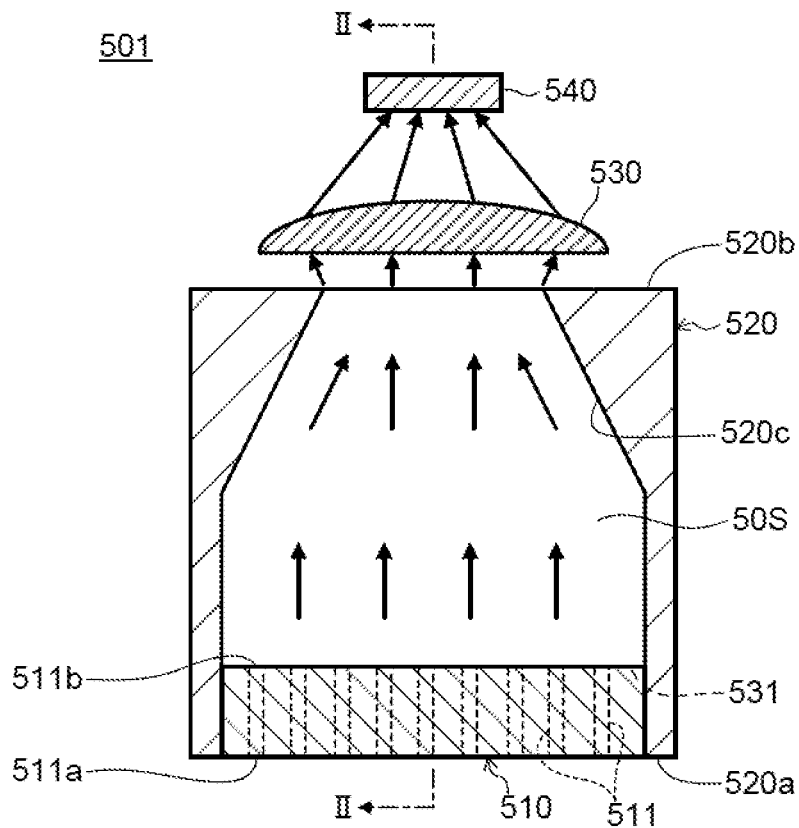
FIG. 8 is a sectional view illustrating a laser module according to a fifth embodiment of the present disclosure.
Figure 9:
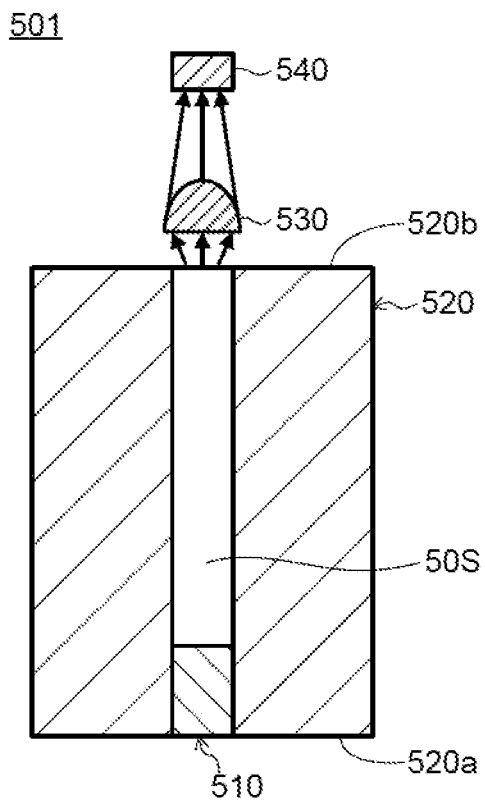
FIG. 9 is a sectional view along line II-II of FIG. 8.

A laser module according to a fifth embodiment of the present disclosure is described below with reference to the drawings. FIGS. 8 and 9 are sectional views illustrating a configuration of laser module 501. Laser module 501 includes laser diode bar 510, housing 520, condenser lens 530, and detector 540.

Laser diode bar 510 has a rectangular shape in plan view. Laser diode bar 510 includes a plurality of light waveguide type emitters 511. A plurality of emitters 511 are disposed side by side in the longitudinal direction of laser diode bar 510.

The plurality of emitters 511 includes a light-emitting layer (not illustrated in the drawing) that emits light when a voltage is applied and a current is supplied. Front end surface 511a and rear end surface 511b of light waveguide type emitter 511 are disposed on the opposite sides in the short direction of laser diode bar 510. Front end surface 511a and rear end surface 511b of emitter 511 are provided to reflect light. The light reflectance of front end surface 511a is lower than the light reflectance of rear end surface 511b. The light reflectance of rear end surface 511b is equal to or greater than 90% and smaller than 100%, preferably equal to or greater than 95%.

The light generated at the light-emitting layer is reflected by front end surface 511a and rear end surface 511b and thus repeatedly reciprocated in the light waveguide (not illustrated in the drawing), and, amplified. Through laser oscillation, the amplified light is emitted as laser light from front end surface 511a along the direction orthogonal to front end surface 511a.

On the other hand, when the light generated at the light-emitting layer is repeatedly reciprocated in the light waveguide, a part of the light generated at the light-emitting layer leaks from rear end surface 511b along the direction orthogonal to rear end surface 511b. In FIGS. 8 to 13, the solid thick arrow represents light leaked from rear end surface 511b.

Housing 520 includes space 50S extending from front surface 520a of housing 520 to opposite surface 520b on the side opposite to front surface 520a. In space 50S, laser diode bar 510 is fixed such that front end surfaces 511a of the plurality of emitters 511 is exposed to front surface 520a side of housing 520 and that rear end surface 511b faces the inside of space 50S. In this manner, light leaks from rear end surfaces 511b of the plurality of emitters 511 toward space 50S.

Space 50S has a shape with which the light leaked from rear end surfaces 511b of all of the plurality of emitters 511 is guided to the outside. Specifically, space 50S makes up a passage that transmits the light leaked from rear end surfaces 511b of all of the plurality of emitters 511 and guides the light to the outside of housing 520. The light leaked from rear end surfaces 511b of some or all of the plurality of emitters 511 may be reflected by the inner surface of housing 520 making up space 50S when transmitted through space 50S.

More specifically, space 50S extends in the short direction of laser diode bar 510. In addition, the thickness of space 50S is greater than the thickness of laser diode bar 510 (FIG. 9). Laser diode bar 510 is connected to a submount member (not illustrated in the drawing) with a relatively high heat-dissipation property through an AuSn solder layer or the like. Further, space 50S includes inclined surface 520c with which the length of space 50S in the width direction (the longitudinal direction of laser diode bar 510) decreases in the direction from front surface 520a side toward opposite surface 520b side. Thus, the opening on opposite surface 520b side in space 50S is downsized, and condenser lens 530 described later can have a small size. Note that space 50S may have a shape with a constant length in the width direction without including inclined surface 520c.

Light guided from rear end surfaces 511b of all of the plurality of emitters 511 impinges on condenser lens 530. Condenser lens 530 is disposed outside housing 520. All the light guided from space 50S impinges on condenser lens 530. Note that condenser lens 530 may be composed of a combination of a plurality of lenses.

Detector 540 is disposed at a position where light passed through condenser lens 530 converges (in the vicinity of the focal point). Thus, light leaked from rear end surfaces 511b of all of the plurality of emitters 511 impinges on detector 540. Detector 540 outputs a detection signal corresponding to the intensity of the detected light. Detector 540 is a photodiode (e.g., a PIN-type photodiode).

Since detector 540 and condenser lens 530 are disposed outside housing 520, the degree of freedom of the layout of detector 540 and condenser lens 530 can be improved in comparison with the case where detector 540 and condenser lens 530 are disposed inside housing 520. In addition, housing 520 can be downsized.

Next, an operation of the above-described laser module 501 is described. When a voltage is applied to the plurality of emitters 511, laser light is emitted from front end surface 511a, and light leaks from rear end surface 511b toward space 50S.

The light leaked from rear end surfaces 511b of all of the plurality of emitters 511 is transmitted through space 50S and guided to the outside of housing 520. The light guided from housing 520 passes through condenser lens 530 and impinges on detector 540. That is, the light leaked from rear end surfaces 511b of all of the plurality of emitters 511 impinges on detector 540. Detector 540 outputs a detection signal corresponding to the intensity of the incident light.

Next, a case where the light emission characteristics of at least one emitter 511 of the plurality of emitters 511 are degraded is described. When the light emission characteristics of at least one emitter 511 of the plurality of emitters 511 are degraded, the intensity of the light leaked from rear end surface 511b of the one emitter 511 decreases. In this manner, the intensity of the light that impinges on detector 540 through space 50S and condenser lens 530 decreases. As a result, the detection signal of detector 540 changes.

That is, by monitoring the detection signal, the occurrence of the degradation of the light emission characteristics at least one emitter 511 of the plurality of emitters 511 can be detected based on the change of the detection signal. The same applies to the case where the intensity of the light leaked from rear end surface 511b is reduced due to defects of laser module 501. Thus, the degradation of the light emission characteristics and the defects of laser module 501 can be detected.

Sixth Embodiment

Figure 10:
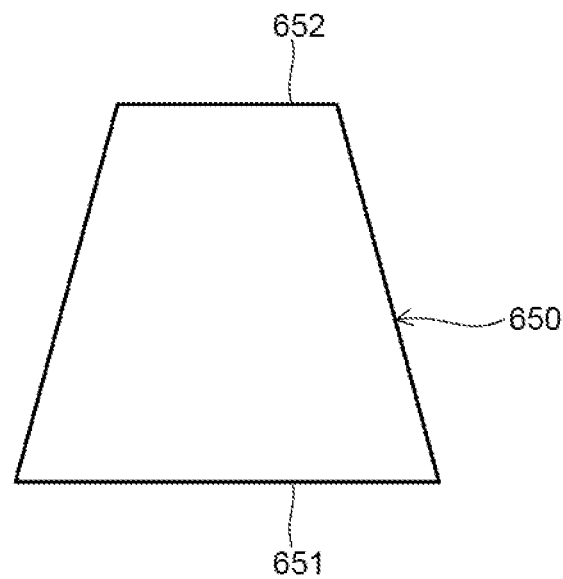
FIG. 10 is a plan view of a light guiding member including a laser module according to a sixth embodiment of the present disclosure.

Next, laser module 501 according to a sixth embodiment of the present disclosure is described with reference to FIG. 10 mainly regarding differences from the fifth embodiment. Laser module 501 of the sixth embodiment further includes light guiding member 650.

Light guiding member 650 guides, to condenser lens 530, the light leaked from rear end surfaces 511b of all of the plurality of emitters 511. Light guiding member 650 is formed in a plate shape with a transparent resin material. Light guiding member 650 includes introduction surface 651 and guiding surface 652 as the surface on the side opposite to introduction surface 651. Light guiding member 650 has a shape with a width that decreases toward guiding surface 652 from introduction surface 651. Note that the shape of light guiding member 650 may be the same as or different from space 50S as long as all of the light entered from introduction surface 651 can be emitted from guiding surface 652 and it can be disposed inside space 50S (see FIG. 8).

Light guiding member 650 is disposed inside space 50S. Introduction surface 651 faces rear end surfaces 511b of all of the plurality of emitters 511, and introduces the light leaked from rear end surfaces 511b of all of the plurality of emitters 511. Guiding surface 652 guides all of the light introduced from introduction surface 651. Guiding surface 652 faces condenser lens 530. Thus, the light guided from guiding surface 652 is guided to the outside of housing 520, and impinges on condenser lens 530.

With light guiding member 650, the light leaked from rear end surfaces 511b of all of the plurality of emitters 511 can reliably impinge on condenser lens 530.

Note that a scattering member may be provided inside light guiding member 650. With the scattering member, the light guided inside light guiding member 650 is scattered. In this manner, the intensity of the light leaked from rear end surfaces 511b of the plurality of emitters 511 is uniformed when guided inside light guiding member 650, and thus the light with the uniformed intensity can be guided from guiding surface 652.

Seventh Embodiment

Figure 11:
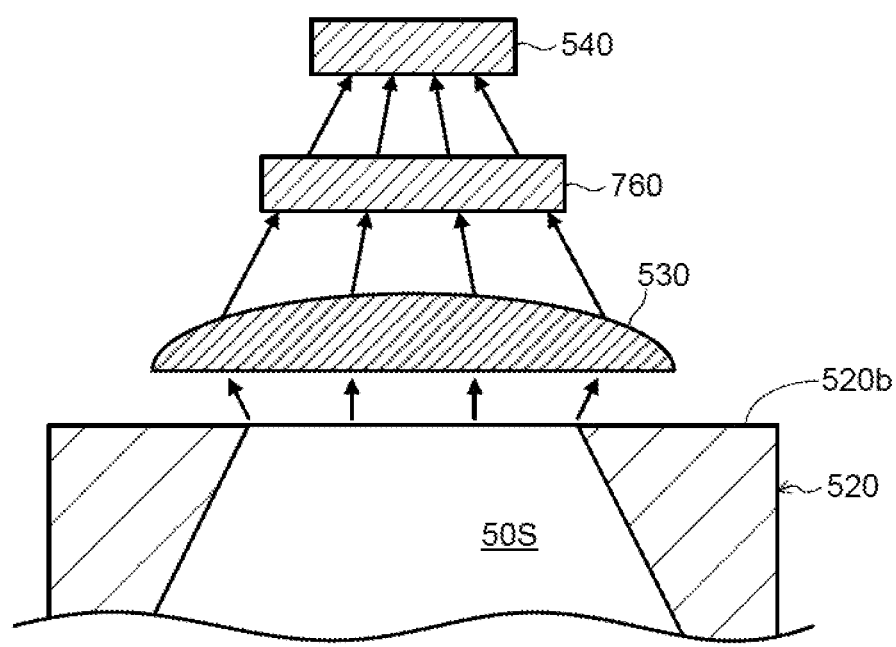
FIG. 11 is a partially enlarged sectional view illustrating a laser module according to a seventh embodiment of the present disclosure.

Next, laser module 501 according to a seventh embodiment of the present disclosure is described with reference to FIG. 11 mainly regarding differences from the fifth embodiment. Laser module 501 of the seventh embodiment further includes light reduction member 760.

Light reduction member 760 attenuates the light leaked from rear end surfaces 511b of the plurality of emitters 511. Light reduction member 760 is a light reduction filter, a scattering plate or a partial transmission mirror. Light reduction member 760 is disposed between condenser lens 530 and detector 540. Light reduction member 760 has a size that allows for incidence of the light passed through condenser lens 530, that is, the light leaked from rear end surfaces 511b of all of the plurality of emitters 511. That is, light reduction member 760 reduces the light leaked from rear end surfaces 511b of all of the plurality of emitters 511. Detector 540 detects the light passed through light reduction member 760.

In this manner, even in the case where the intensity of the light leaked from rear end surfaces 511b of the plurality of emitters 511 is relatively large, detector 540 can detect the light leaked from rear end surfaces 511b of all of the plurality of emitters 511, within the range of the light intensity that can be appropriately detected by detector 540 detected. Note that it goes without saying that the position and the size of light reduction member 760 are not limited to the above-described position and size as long as the light leaked from rear end surfaces 511b of all of the plurality of emitters 511 can be reduced. It suffices that light reduction member 760 is disposed between rear end surface 511b and detector 540, and it may be disposed between housing 520 and condenser lens 530, for example.

Eighth Embodiment

Figure 12:
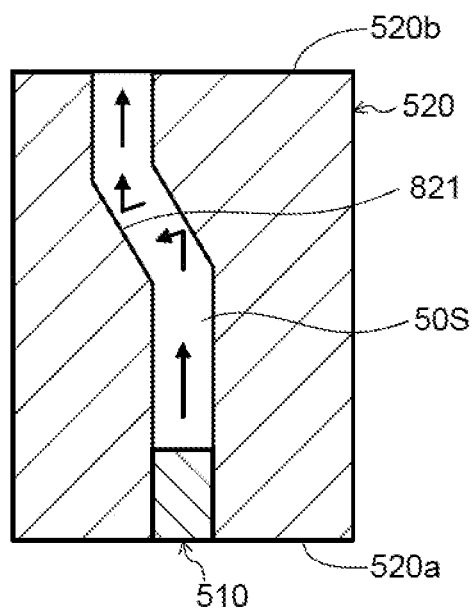
FIG. 12 is a sectional view of a housing of a laser module according to an eighth embodiment of the present disclosure.

Next, laser module 501 according to an eighth embodiment of the present disclosure is described with reference to FIGS. 12 and 13 mainly regarding differences from the fifth embodiment.

In the eighth embodiment, the inner surface of housing 520 that forms space 50S is composed of reflecting surface 821. Reflecting surface 821 reflects the light leaked from rear end surface 511b in a scattering manner.

Reflecting surface 821 has a rough surface. Reflecting surface 821 is a sprinkled surface with fine irregularities. In this manner, reflecting surface 821 can efficiently scatter the light leaked from rear end surface 511b. Note that reflecting surface 821 may be coated with a coating agent containing scattering members such as nitric acid barium and titanium oxide.

In addition, the absorptivity of the light leaked from rear end surface 511b at reflecting surface 821 is equal to or greater than 10%. In this manner, even when the light leaked from rear end surface 511b is repeatedly reflected, the attenuation of the intensity of the light reflected from rear end surface 511b can be suppressed.

Space 50S is provided such that the light leaked from rear end surfaces 511b of all of the plurality of emitters 511 and reflected by reflecting surface 821 is guided to the outside of housing 520. Specifically, space 50S forms a passage that guides, to the outside of housing 520, the light leaked from rear end surfaces 511b of all of the plurality of emitters 511. In addition, space 50S has a shape in which reflecting surface 821 repeatedly reflects the light leaked from rear end surface 511b. Space 50S has a crank shape in a cross section, for example. It suffices that the shape of space 50S has a structure that can facilitate the scattering of the light and uniform the intensity of the light.

The light leaked from rear end surfaces 511b of all of the plurality of emitters 511 is repeatedly reflected by reflecting surface 821, and thus the intensity of the light leaked from rear end surfaces 511b of all of the plurality of emitters 511 is uniformed inside space 50S. Then, the light whose intensity is uniformed inside space 50S is guided to the outside of housing 520, and impinges on condenser lens 530.

Figure 13:
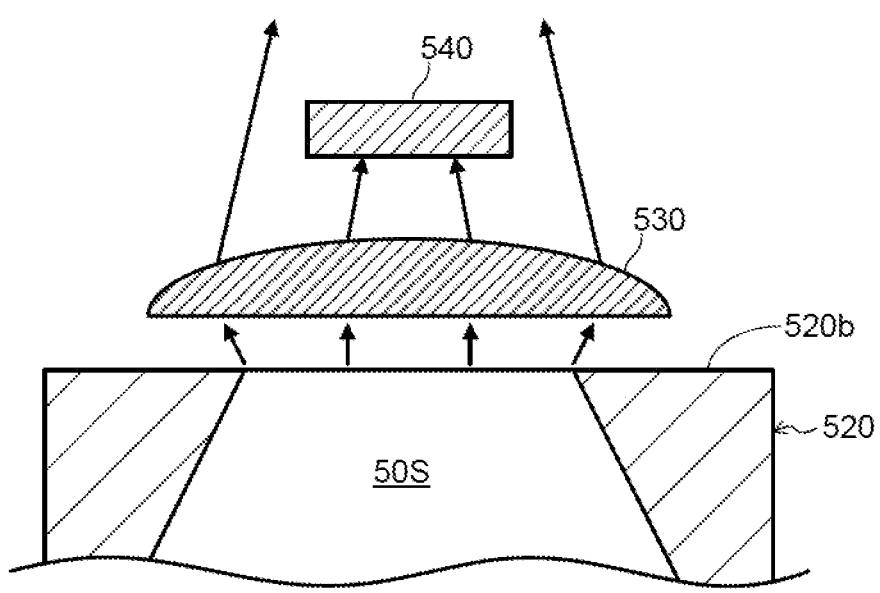
FIG. 13 is a diagram illustrating a position of a detector in the laser module according the eighth embodiment of the present disclosure.

In addition, as illustrated in FIG. 13, detector 540 detects a part of the light transmitted through condenser lens 530. Detector 540 is disposed closer to condenser lens 530 than the focal point of condenser lens 530. Detector 540 outputs a detection signal corresponding to the intensity of the detected light.

As described above, with reflecting surface 821, the intensity of the light leaked from rear end surfaces 511b of all of the plurality of emitters 511 is uniformed. When the light emission characteristics of at least one emitter 511 of the plurality of emitters 511 are degraded, the intensity of the light leaked from rear end surface 511b of one emitter 511, and in turn, the intensity of the light uniformed by reflecting surface 821, is reduced. Thus, the intensity of a part of the light that impinges on detector 540 via condenser lens 530 is reduced. In this manner, the detection signal of detector 540 changes.

As described above, even in the case where a part of the light passed through condenser lens 530 is detected by detector 540, the degradation of the light emission characteristics of at least one emitter 511 of the plurality of emitters 511 can be detected based on the change of the detection signal by monitoring the detection signal. In addition, detector 540 detects a part of the light passed through condenser lens 530, and thus can appropriately detect even the light with a relatively large intensity leaked from rear end surfaces 511b of the plurality of emitters 511, within the range of the light intensity that can be detected by detector 540. Since the intensity of the light is uniformed inside space 50S, the entire light intensity can be estimated even with the configuration of detecting a part of the light.

Laser Oscillator and Laser Processing System

Figure 14:
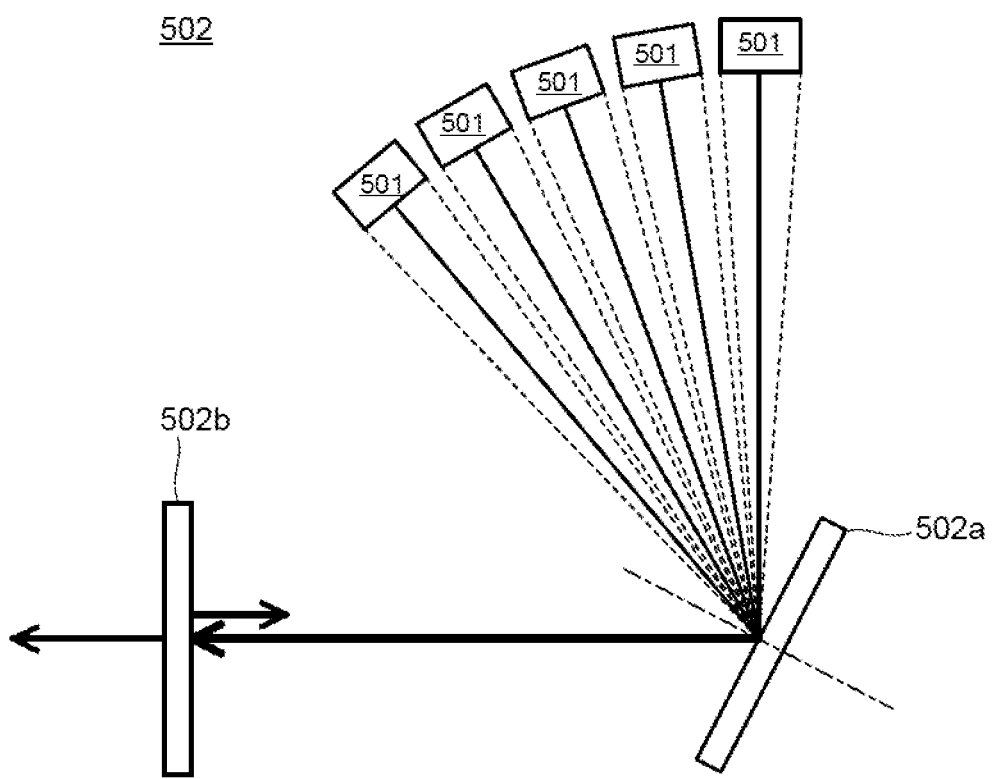
FIG. 14 is a schematic view illustrating a configuration of the laser oscillator used for the laser processing system of the present disclosure.

The laser processing system is a system used for metal processing of high output laser light and the like, and includes high output laser oscillator 502 that outputs laser light of 100 W to several kW or greater, an optical fiber (not illustrated in the drawing), a laser processing head (not illustrated in the drawing), a movable stage (not illustrated in the drawing) for placing workpieces, and the like. As illustrated in FIG. 14, high output laser oscillator 502 used for the laser processing system includes a plurality of laser modules 501, diffraction grating 502a, and external resonance mirror 502b.

The plurality of laser modules 501 are arranged in a line. Diffraction grating 502a is a transmitting or reflecting diffraction grating. External resonance mirror 502b is a partial transmission mirror.

Laser light is emitted from the plurality of emitters 511 of respective laser modules 501. The laser light emitted from respective laser modules 501 impinges on diffraction grating 502a.

Diffraction grating 502a diffracts the incident laser light at the diffraction angle determined by the wavelength of the laser light and emits the light. The laser light emitted from diffraction grating 502a impinges on external resonance mirror 502b.

External resonance mirror 502b perpendicularly reflects a part of the incident laser light, in the direction of diffraction grating 502a. In this manner, only the wavelength that satisfies the diffraction condition of diffraction grating 502a in the positional relationship between emitters 511 of the plurality of laser modules 501, diffraction grating 502a, and external resonance mirror 502b is fed back between laser module 501 and external resonance mirror 502b and externally resonated and oscillated, and thus the laser light is output. In this case, it is desirable that the reflectance of the front end surface of laser module 501 is equal to or smaller than 0.5%, more preferably equal to or smaller than 0.1%, and that only the external resonance oscillation at external resonance mirror 502b is generated, without generating the internal resonance oscillation at light waveguide end surfaces 511a and 511b of laser module 501. Note that a beam twister unit (not illustrated in the drawing) that rotates laser light 90 degrees around the optical axis may be disposed between diffraction grating 502a and the plurality of laser modules 501.

When metal processing or the like is performed by using the laser processing system, each detection signal output from detector 540 of the plurality of laser modules 501 making up high output laser oscillator 502 is monitored in real time. Thus, the change of the detection signal is detected in real time. Thus, the degradation of the light emission characteristics and the defects of laser module 501 can be individually detected. In addition, the laser module 501 where the degradation of the light emission characteristics and the like occur can be detected from among the plurality of laser modules 501.

The present disclosure is not limited to the forms described so far. As long as the main purpose of this disclosure is not departed from, various modifications to this embodiment and embodiments constructed by combining components in different embodiments are also included within the scope of this disclosure.

For example, condenser lens 530 and detector 540 are disposed outside housing 520 in each embodiment. Alternatively, condenser lens 530 may be disposed inside space 50S of housing 520. In addition, condenser lens 530 and detector 540 may be disposed inside housing 520 of space 50S.

In addition, in each embodiment, laser module 501 may not include housing 520. In this case, condenser lens 530 is disposed such that the light leaked from rear end surfaces 511b of all of the plurality of emitters impinges on it.

In addition, light guiding member 650 is composed of one plate-shaped member in the sixth embodiment, but alternatively, it may be composed of a plurality of plate-shaped members and a plurality of rod shape members. In addition, a part or the entirety of light guiding member 650 may be disposed outside housing 520.

In addition, in the sixth embodiment, a groove for diffusing the light leaked from rear end surface 511b may be provided in the exterior surface of light guiding member 650. In this manner, the light leaked from rear end surface 511b is diffused inside light guiding member 650, and thus the intensity of the light leaked from rear end surfaces 511b of all of the plurality of emitters 511 can be uniformed. In this case, as in the eighth embodiment, detector 540 may detect a part of the light passed through condenser lens 530.

In addition, while the laser light is emitted from front end surface 511a of emitter 511 and the light leaks from rear end surface 511b of emitter 511 in each of the above-described embodiments, it goes without saying that this is not limitative. Specifically, it suffices that the laser light is emitted from the surface (i.e., the front surface) exposed to the outside from housing 520 in emitter 511. In addition, it suffices that the light leaks from the surface (i.e., the rear surface) facing space 50S in emitter 511.

The present disclosure is not limited to the forms described so far. As long as the main purpose of this disclosure is not departed from, various modifications to this embodiment and embodiments constructed by combining components in different embodiments are also included within the scope of this disclosure.

INDUSTRIAL APPLICABILITY

The present invention is widely applicable to laser modules, high output laser oscillators, and laser processing systems.

REFERENCE SIGNS LIST

1 Laser module
2 High output laser oscillator 2a Diffraction grating
2b External resonance mirror
10 Laser diode bar 11 Emitter
11a Front end surface
11b Rear end surface
20 Housing
21 Reflecting surface
30 Detector
31 Light-receiving surface
32 Back surface
S Space
501 Laser module
502 High output laser oscillator 510 Laser diode bar 511 Emitter
511a Front end surface
511b Rear end surface
520 Housing
530 Condenser lens
540 Detector
650 Light guiding member
760 Light reduction member
821 Reflecting surface
50S Space

The invention claimed is:

1. A laser module comprising:
a laser diode bar including a plurality of emitters configured to emit laser light from a front surface and leak light from a rear surface;
a housing including a reflecting surface configured to surround a space together with the laser diode bar and reflect, toward the space, light leaked from the rear surface, in a scattering manner; and
a detector configured to detect light reflected by the reflecting surface.

2. The laser module according to claim 1, wherein the detector is disposed such that a light-receiving surface of the detector faces a side of the reflecting surface.

3. The laser module according to claim 1, wherein the reflecting surface has a rough surface.

4. The laser module according to claim 1, wherein the reflecting surface has a shape configured to repeatedly reflect the light leaked from the rear surface.

5. The laser module according to claim 1, wherein the housing includes a passage configured to guide, to outside, a part of the light reflected by the reflecting surface.

6. A laser oscillator comprising a plurality of the laser modules according to claim 1.

7. A laser processing system comprising a plurality of the laser modules according to claim 1.

8. A laser module comprising:
a laser diode bar including a plurality of emitters configured to emit laser light from a front surface and leak light from a rear surface;
a condenser lens on which light leaked from rear surfaces of all of the plurality of emitters impinges; and
a detector configured to detect light transmitted through the condenser lens.

9. The laser module according to claim 8, further comprising a light guiding member configured to guide, to the condenser lens, the light leaked from the rear surface.

10. The laser module according to claim 8, further comprising a light reduction member configured to attenuate the light leaked from the rear surface.

11. The laser module according to claim 8, further comprising a housing including a passage configured to transmit the light leaked from the rear surface and guide, to outside, the light leaked from the rear surface,
wherein the condenser lens is disposed outside the housing; and
wherein light transmitted through the passage impinges on the condenser lens.

12. The laser module according to claim 11,
wherein the housing further includes a reflecting surface configured to surround the passage and reflect the light leaked from the rear surface in a scattering manner;
wherein the passage guides, to the outside, light reflected by the reflecting surface; and
wherein the detector detects a part of the light transmitted through the condenser lens.

13. A laser oscillator comprising a plurality of the laser modules according to claim 8.

14. A laser processing system comprising a plurality of the laser modules according to claim 8.

* * * * *